United States Patent
Abe et al.

(10) Patent No.: US 10,972,089 B2
(45) Date of Patent: Apr. 6, 2021

(54) SEMICONDUCTOR DEVICE

(71) Applicant: FUJI ELECTRIC CO., LTD., Kawasaki (JP)

(72) Inventors: Yuya Abe, Matsumoto (JP); Takanori Kohama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 309 days.

(21) Appl. No.: 16/119,206

(22) Filed: Aug. 31, 2018

(65) Prior Publication Data

US 2019/0115910 A1    Apr. 18, 2019

(30) Foreign Application Priority Data

Oct. 17, 2017 (JP) .............................. JP2017-201343

(51) Int. Cl.
  *H03K 17/08* (2006.01)
  *H03K 17/082* (2006.01)
  *F02P 3/055* (2006.01)
  *H03K 17/74* (2006.01)

(52) U.S. Cl.
  CPC ........ *H03K 17/0828* (2013.01); *F02P 3/0552* (2013.01); *F02P 3/0554* (2013.01); *H03K 17/74* (2013.01)

(58) Field of Classification Search
  CPC ... H03K 17/0828; H03K 17/74; F02P 3/0552; F02P 3/0554; H02H 3/08
  See application file for complete search history.

(56) References Cited

U.S. PATENT DOCUMENTS

| 5,793,674 A * | 8/1998 | Kubo .................... G06F 11/006 |
| | | 365/185.09 |
| 2003/0206040 A1* | 11/2003 | Sakata .................... H02M 1/32 |
| | | 327/108 |
| 2010/0059028 A1 | 3/2010 | Ueno |
| 2014/0015005 A1 | 1/2014 | Ishii |
| 2014/0035611 A1* | 2/2014 | Sato ................... G01R 31/2608 |
| | | 324/762.08 |
| 2014/0345583 A1 | 11/2014 | Ueno |
| 2015/0260760 A1 | 9/2015 | Katakura et al. |

FOREIGN PATENT DOCUMENTS

| JP | 2000-179440 A | 6/2000 |
| JP | 2010-045141 A | 2/2010 |
| JP | 2014-013798 A | 1/2014 |
| JP | 2015-194460 A | 11/2015 |

* cited by examiner

*Primary Examiner* — Scott Bauer (57) ABSTRACT

A semiconductor device includes a power semiconductor switching element including a characteristic test terminal, and a control circuit configured to control an operation of the power semiconductor switching element. The power semiconductor switching element and the control circuit are formed in a same chip. The control circuit includes a gate voltage generation circuit configured to generate a current limit gate voltage for restricting an overcurrent flowing in the power semiconductor switching element in a desired range when an abnormality occurs, based on a characteristic of the power semiconductor switching element which is measured in advance by applying a voltage to the characteristic test terminal.

7 Claims, 6 Drawing Sheets

OPERATION WAVEFORM OF
RELATED ART

START TIMING OF
OVERCURRENT PROTECTION OPERATION

SEMICONDUCTOR DEVICE

CROSS-REFERENCE TO RELATED APPLICATIONS

The present application claims priority from Japanese Patent Application No. 2017-201343, filed Oct. 17, 2017, the entire content of which is incorporated herein by reference.

TECHNICAL FIELD

The present invention relates to a semiconductor device, and more particularly relates to a semiconductor device which includes a power semiconductor switching element and a control circuit thereof in the same chip and which has an element protection function.

BACKGROUND ART

In order to perform ignition control of an internal combustion engine of an automobile or the like, a semiconductor device called an one-chip igniter is employed which includes, for example, an IGBT and a control circuit thereof in the same chip (for example, see JP-A-2000-179440 and JP-A-2014-013798). In this kind of one-chip igniter, it is important to protect the circuit in the one-chip igniter from an overcurrent.

In order to protect the circuit in the one-chip igniter from an overcurrent, there has been known an one-chip igniter which has a function of detecting an overcurrent. This kind of one-chip igniter employs, for example, a method of connecting a current-detection shunt resistor in series with an IGBT which interrupts a current flowing in the primary side of an ignition coil, or a method of connecting a current sensing IGBT in parallel to an IGBT (also called a main IGBT).

In the method of connecting the shunt resistor in series with the IGBT, a sum of a collector-emitter saturation voltage of the IGBT and a voltage generated across the shunt resistor becomes large, so that this method has a disadvantage that a loss of the one-chip igniter increases. Thus, currently the method of connecting the current sensing IGBT in parallel to the main IGBT has been mainly employed.

However, this method requires to include, in the one-chip igniter, the current sensing IGBT, a resistor for detecting a current flowing in the current sensing IGBT, a control circuit for controlling respective gate voltages applied to the main IGBT and the current sensing IGBT based on a current detected in the current sensing IGBT, and the like. In recent years, downsizing of the chip has been requested, but this method is difficult to meet this need. Further, this method has a problem that the elements other than the main IGBT are included in the one-chip igniter, so that a cost of the chip increases.

Further, a Hall current flowing into the current sensing IGBT from the main IGBT changes depending on a disposing position of the current sensing IGBT in the chip. In this case, a ratio between a current flowing into the main IGBT and a current flowing into the current sensing IGBT, i.e., a sense ratio changes. Thus, in each case of changing the chip size of the product, an area of the IGBT, and the like, it is necessary to change the size and the position of the current sensing IGBT and the circuit design of the control circuit in consideration of the sense ratio.

SUMMARY

The present invention has been made in view of the above circumstances, and an aspect of the present invention provides a semiconductor device which has an element protection function while further simplifying a circuit configuration.

A semiconductor device according to an embodiment of the present invention includes a power semiconductor switching element including a characteristic test terminal, and a control circuit configured to control an operation of the power semiconductor switching element, wherein the power semiconductor switching element and the control circuit are formed in a same chip, wherein the control circuit includes a gate voltage generation circuit configured to generate a current limit gate voltage for restricting an overcurrent flowing in the power semiconductor switching element in a desired range when an abnormality occurs, based on a characteristic of the power semiconductor switching element which is measured in advance by applying a voltage to the characteristic test terminal.

The characteristic test is a test for measuring an electric characteristic, such as a characteristic of the control circuit, in a wafer state. The current limit gate voltage is a gate voltage of the power semiconductor switching element, for example, an IGBT, which restricts the upper limit value of current flowing in the IGBT (for example, a collector-emitter current of the IGBT). Conventionally, this kind of semiconductor device includes a current sensing resistor for detecting an overcurrent and a current sensing IGBT other than a main IGBT. The current sensing resistor and the current sensing IGBT impede downsizing of the chip. Further, in order to achieve the element protection, it is necessary to consider characteristic variation of the current sensing resistor and the current sensing IGBT. In contrast, according to the above-described configuration, the current limit gate voltage at the time when an overcurrent of a desired limit value flows in the IGBT is measured in advance in the characteristic test, and the voltage applied to the gate of the IGBT is adjusted on the control circuit side of the IGBT so as to be the current limit gate voltage. Consequently, according to this configuration, the IGBT can be protected from the overcurrent without using the current sensing resistor or the current sensing IGBT, so that the element protection can be achieved without considering the chip downsizing or the characteristic variation of the other elements such as the current sensing IGBT.

According to an embodiment of the present invention, a semiconductor device which has an element protection function while further simplifying a circuit configuration can be provided.

DETAILED DESCRIPTION OF EMBODIMENTS

Hereinafter, a semiconductor device according to an embodiment of the present invention will be explained in detail with reference to drawings concerning an one-chip igniter as an example. The feature of the present invention is that a circuit can be protected from an overcurrent without using current detection elements such as a shunt resistor and a current sensing IGBT. An example of a circuit configuration for attaining such a feature will be explained.

(Configuration)

Figure 1:
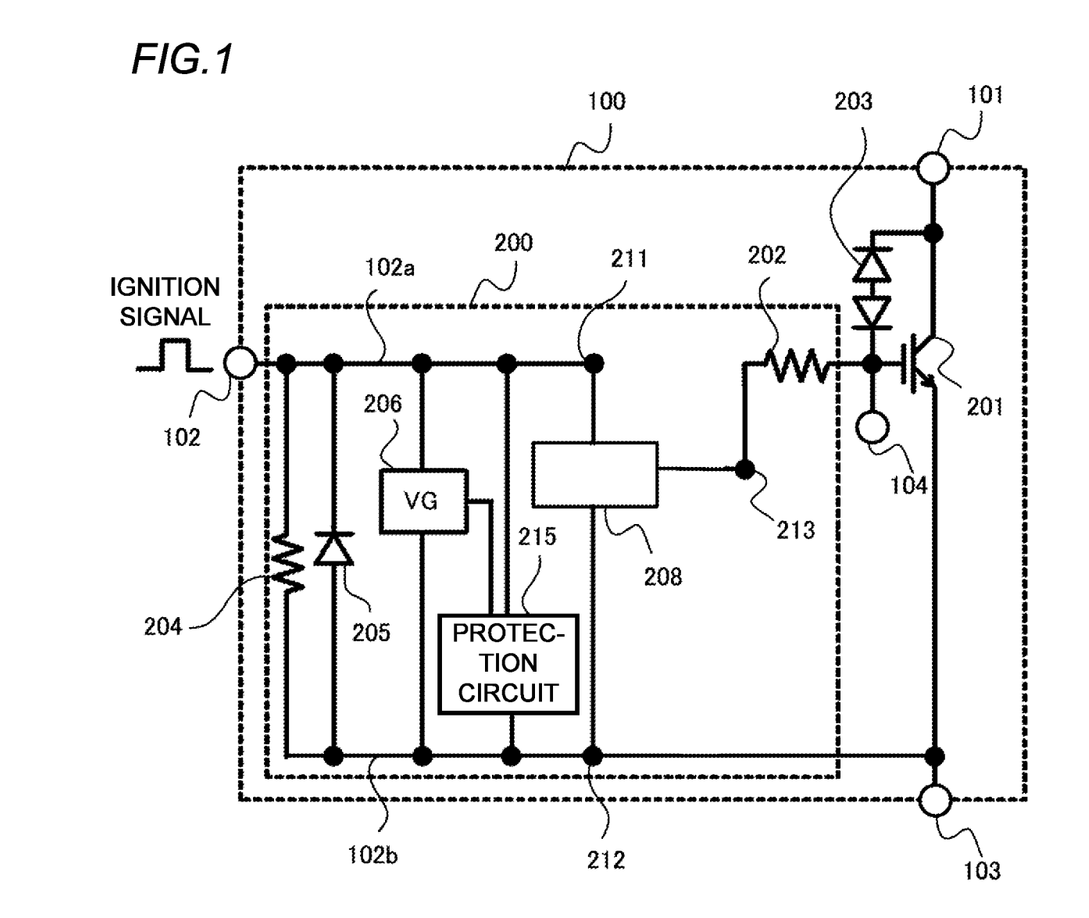
FIG. 1 is a circuit diagram showing a configuration of an one-chip igniter according to an embodiment of the present invention.

As shown in FIG. 1, the semiconductor device according to the embodiment of the present invention is, for example, an one-chip igniter 100 which is used for ignition control of an internal combustion engine of an automobile or the like. The one-chip igniter 100 includes a control circuit 200 and a power semiconductor switching element 201. The one-chip igniter 100 includes a collector terminal 101, an ignition signal input terminal 102, an emitter terminal 103, and a gate shock terminal (hereinafter called a characteristic test terminal) 104.

First, the power semiconductor switching element 201 will be explained. The power semiconductor switching element 201 includes, for example, an IGBT and is a normally-off type in terms of fail-safe requested for the ignition control of the internal combustion engine. The collector, the emitter, and the gate of the power semiconductor switching element are connected to the collector terminal 101, the emitter terminal 103, and the characteristic test terminal 104, respectively. The gate of the power semiconductor switching element 201 is further connected to a node 213 via a resistor 202. The power semiconductor switching element 201 is turned on/off in accordance with a voltage signal which is applied to the gate via the node 213 from the control circuit 200, more specifically, a trimming circuit 207 which will be described later. A bidirectional diode 203 for dynamic clamp is provided between the collector and the gate of the power semiconductor switching element 201.

The characteristic test terminal 104 is, for example, a terminal to which a predetermined voltage is applied at the time of a characteristic test for measuring an electric characteristic of the control circuit 200 in a wafer state. Details of this terminal will be described later.

Figure 5:
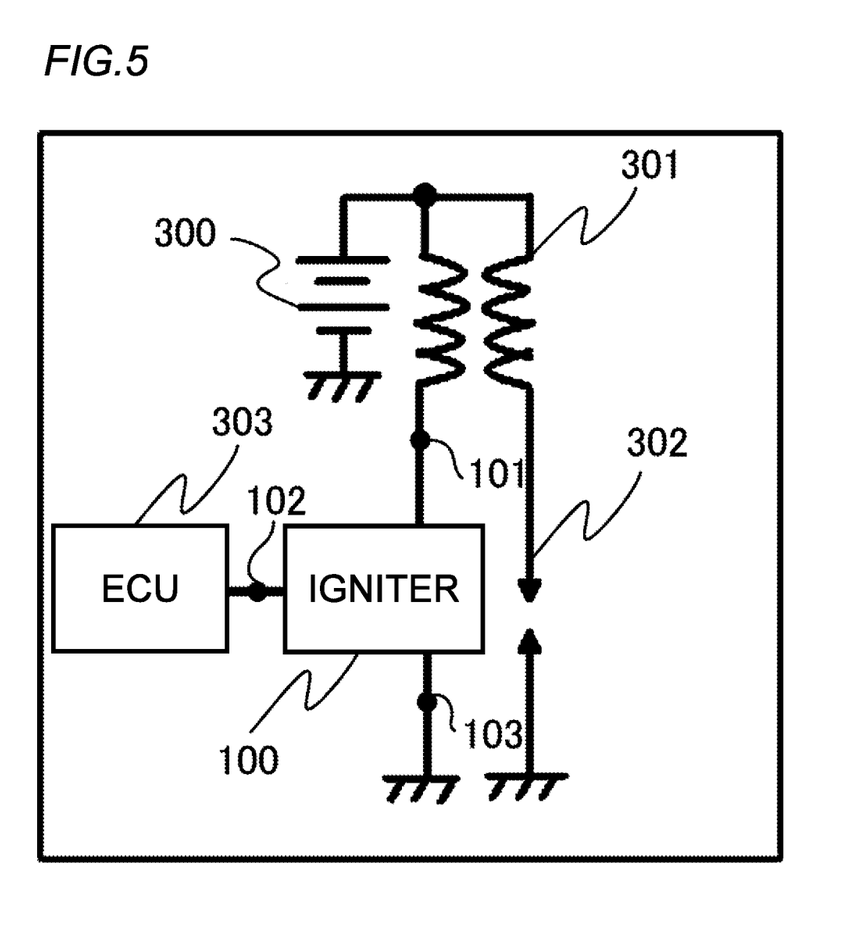
FIG. 5 is a schematic diagram showing a configuration example of an ignition control circuit of an internal combustion engine using the one-chip igniter.

As shown in FIG. 5, the collector of the power semiconductor switching element 201 is connected to one end of the primary side of an ignition coil 301 via the collector terminal 101 and the emitter thereof is grounded via the emitter terminal 103. The other end of the primary side of the ignition coil 301 is connected to a DC power supply 300 and the secondary side thereof is connected to an ignition plug 302. The power semiconductor switching element 201 performs an on/off operation based on an ignition signal inputted to the ignition signal input terminal 102 from an ECU 303, thereby making conductive and nonconductive between the primary side of the ignition coil 301 and the ground. Thus, energy is accumulated in the secondary side of the ignition coil 301 such that the ignition plug 302 emits a spark using the energy.

Returning to FIG. 1, the control circuit 200 includes, in addition to the resistor 202, a resistor 204, a diode 205, a VG circuit 206, a gate voltage generation circuit 208, and a protection circuit 215.

The resistor 204 and the diode 205 are provided for surge measures. The cathode of the diode 205 is connected to an ignition signal wiring 102a. The anode of the diode is connected to the emitter terminal 103 via a ground wiring 102b and thus grounded. The resistor 204 is connected in parallel to the diode 205.

The VG circuit 206 and the protection circuit 215 are, for example, circuits for protecting the power semiconductor switching element 201 from heat. Various related-art circuits can be applied as these circuits, and therefore, detailed explanation of the circuits will be omitted here.

Figure 3:
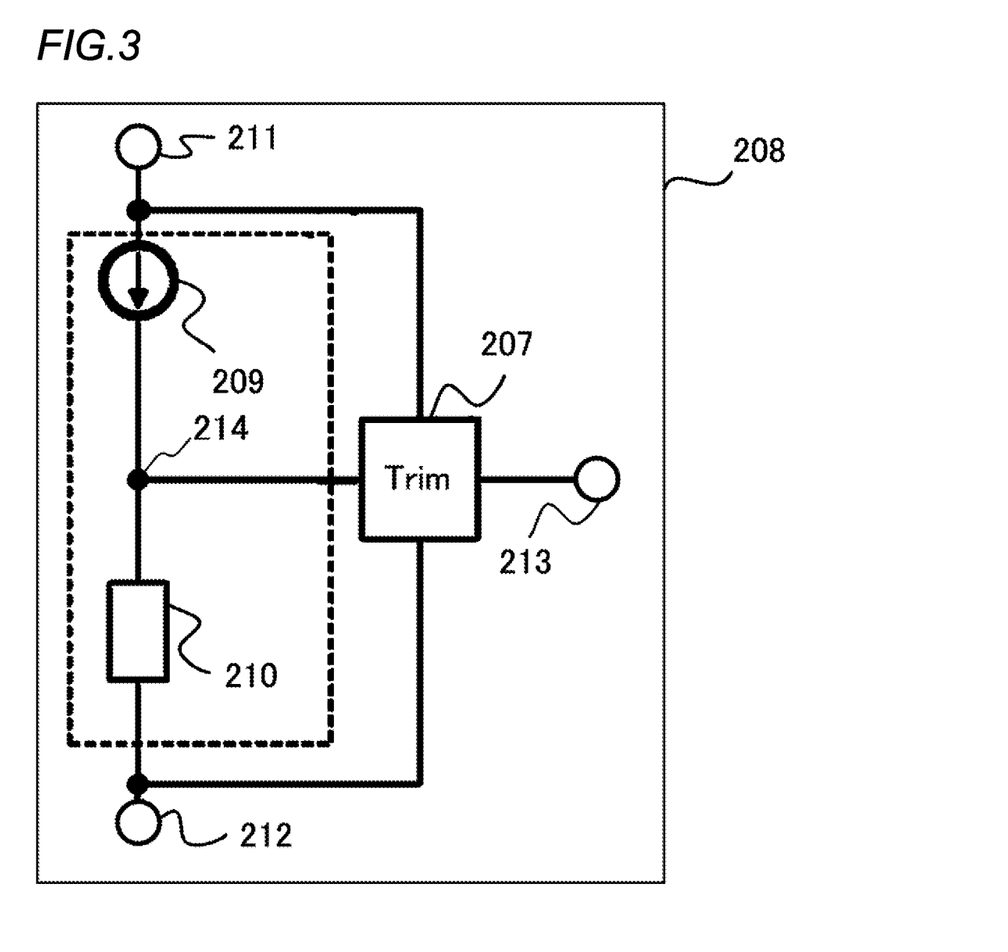
FIG. 3 is a circuit diagram showing a configuration example of a gate voltage generation circuit in FIG. 1.

The gate voltage generation circuit 208 includes an input terminal which is connected to the ignition signal wiring 102a at a node 211, an output terminal which is connected to the gate of the power semiconductor switching element 201 via the node 213 and the resistor 202, and a ground terminal which is connected to the ground wiring 102b at a node 212. As shown in FIG. 3, the gate voltage generation circuit 208 includes a constant current supply 209, a load 210, and the trimming circuit 207. An intermediate node 214 between the constant current supply 209 and the load 210 is connected to an input terminal of the trimming circuit 207. The constant current supply 209 is configured of, for example, a MOSFET and supplies a constant current to the load 210 when the ignition signal inputted to the ignition signal input terminal 102 from the ECU 303 is an H level. The load 210 is configured of, for example, a resistor. A voltage generated from the constant current supply 209 and the load 210 is inputted to the trimming circuit 207 and adjusted to a desired voltage value. In other words, the gate voltage generation circuit 208 trims the voltage generated by the constant current supply 209 and the load 210 using the trimming circuit 207 so as to fall within a range of a desired current limit gate voltage. Details of the current limit gate voltage, etc. will be explained later. Incidentally, although the voltage may be generated by a configuration other than the constant current supply 209 and the load 210, the configuration using the constant current supply 209 and the load 210 is preferable in terms of obtaining a relatively stable voltage.

Figure 4:
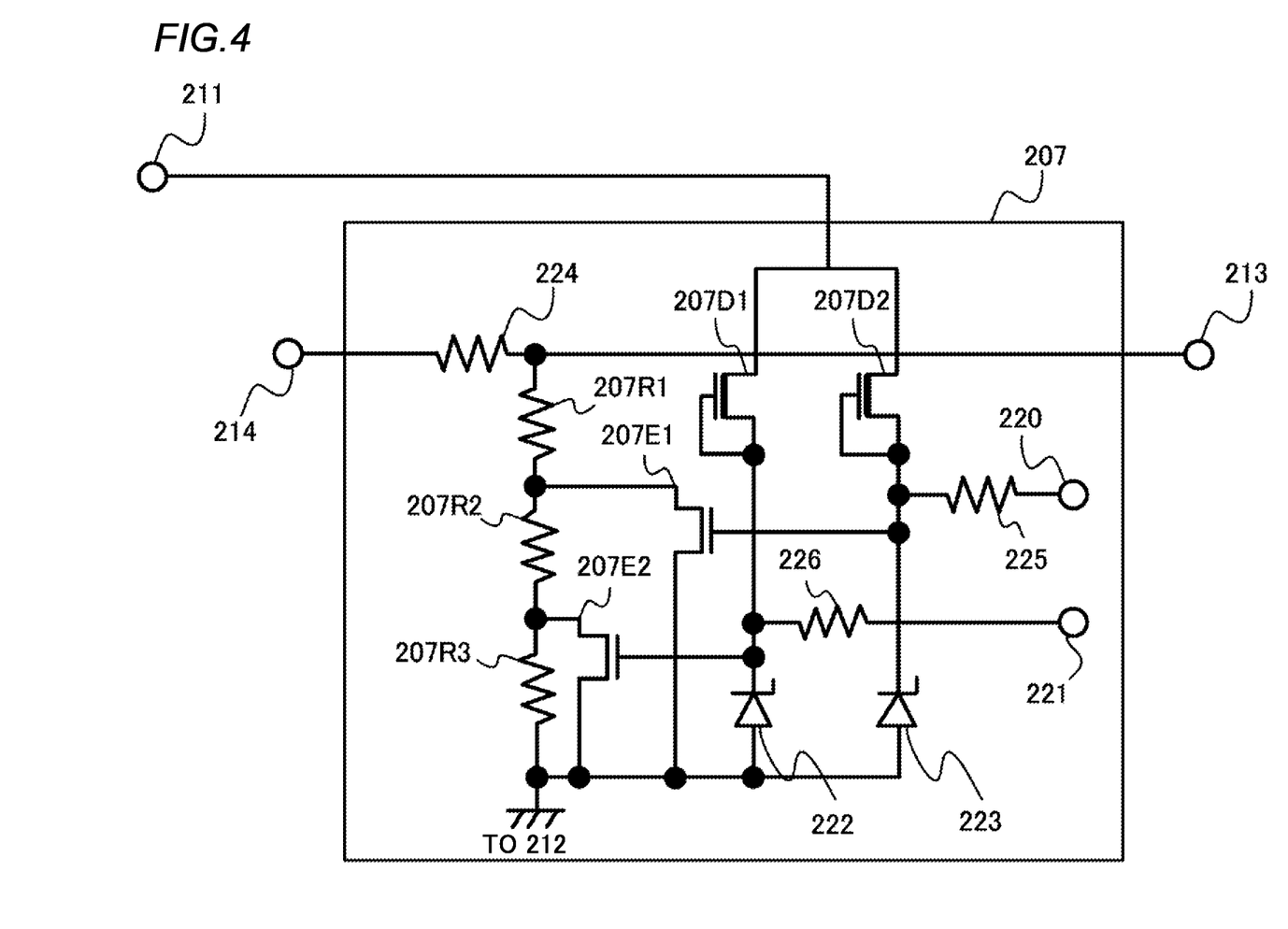
FIG. 4 is a circuit diagram showing a configuration example of a trimming circuit in FIG. 1.

As shown in FIG. 4, the trimming circuit 207 includes first and second enhancement (normally off) type MOSFETs 207E1, 207E2, first and second depression (normally on) type MOSFETs 207D1, 207D2, first to third voltage dividing resistors 207R1 to 207R3, and first and second ZAP Zener diodes 222, 223.

The first to third voltage dividing resistors 207R1 to 207R3 are connected in series. Of one set of the resistors connected in series, one end of the first voltage dividing resistor 207R1 is connected to the node 214 via a circuit protection resistor 224 and connected to the node 213. Of the one set of resistors, another end of the third voltage dividing resistor 207R3 is grounded via the ground wiring 102b. The node 214 serves as the input terminal of the trimming circuit 207 and the node 213 serves as an output terminal of the trimming circuit 207.

The first enhancement type MOSFET 207E1 is, for example, an N type, the drain of which is connected between the first voltage dividing resistor 207R1 and the second voltage dividing resistor 207R2, the gate of which is connected to a first trimming terminal 220 via a circuit protection resistor 225, and the source of which is grounded via the node 212. The second enhancement type MOSFET 207E2 is, for example, an N type, the drain of which is connected between the second voltage dividing resistor 207R2 and the third voltage dividing resistor 207R3, the gate of which is connected to a second trimming terminal 221 via a circuit protection resistor 226, and the source of which is grounded via the node 212.

The first depression type MOSFET 207D1 is, for example, an N type, the drain of which is connected to the ignition signal wiring 102a via the node 211, the gate of which is connected to the own source, and the source of which is connected to the second trimming terminal 221 via the resistor 226 and also connected to the cathode of the first ZAP Zener diode 222. The second depression type MOSFET 207D2 is, for example, an N type, the drain of which is connected to the ignition signal wiring 102a via the node 211, the gate of which is connected to the own source, and the source of which is connected to the first trimming terminal 220 via the resistor 225, connected to the gate of the first enhancement type MOSFET 207E1, and connected to the cathode of the second ZAP Zener diode 223.

The cathode of the first ZAP Zener diode 222 is connected to the gate of the second enhancement type MOSFET 207E2, connected to the second trimming terminal 221 via the resistor 226, and connected to the source of the first depression type MOSFET 207D1. The anode of the first ZAP Zener diode 222 is grounded via the node 212.

The cathode of the second ZAP Zener diode 223 is connected to the first trimming terminal 220 via the resistor 225, connected to the gate of the first enhancement type MOSFET 207E1, and connected to the source of the second depression type MOSFET 207D2. The anode of the second ZAP Zener diode 223 is grounded via the node 212.

(Action)

Next, an element protection action of the one-chip igniter 100 adopting the above-described configuration will be explained. As a method of protecting the power semiconductor switching element 201 from an overcurrent, when an overcurrent flowing in the power semiconductor switching element 201 is smaller than a desired upper limit value when any problem occurs, the power semiconductor switching element 201 can be prevented from being broken. Thus, in this embodiment, the gate voltage of the power semiconductor switching element 201 (IGBT) corresponding to the desired upper limit value is obtained. In other words, the upper limit value of the current flowing in the IGBT is restricted by the gate voltage of the IGBT.

Figure 2:
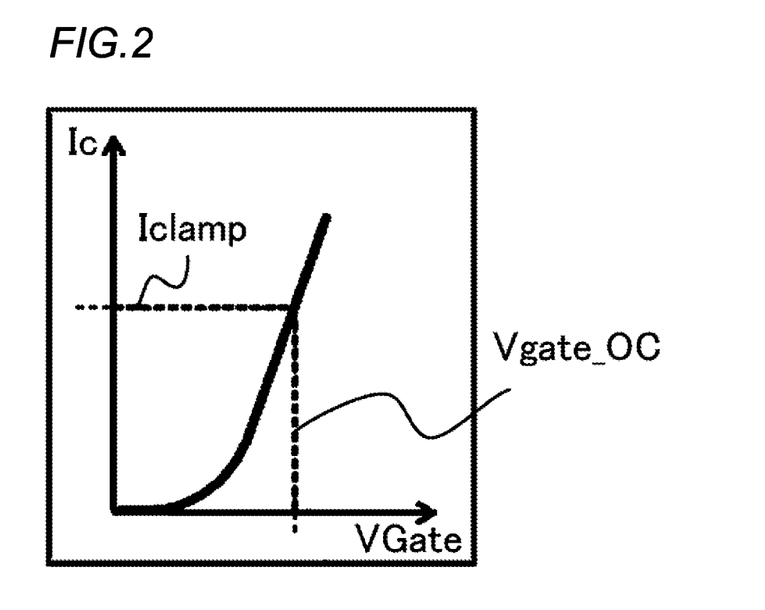
FIG. 2 is a graph showing a forward transfer characteristic (a relationship between a collector current and a gate voltage of an IGBT).

More in detail, as shown in FIG. 2, a current flowing between the collector and the emitter of the normally-off type IGBT and a gate voltage of this IGBT have a relationship as shown by a curve in this figure. Hereinafter, this relationship is called a forward transfer characteristic. The forward transfer characteristic is an example of characteristics obtained at the time of the characteristic test in the embodiment. When such a forward transfer characteristic can be identified, the gate voltage (hereinafter called a current limit gate voltage Vgate_OC) at the time when the collector-emitter current becomes a desired value (hereinafter called Iclamp) can also be identified with reference to the forward transfer characteristic. From this standpoint, in this embodiment, the forward transfer characteristic of the IGBT 201 is obtained by applying predetermined voltages to the characteristic test terminal 104 in a wafer state in a manufacturing stage of the one-chip igniter 100. Next, the voltage Vgate_OC at the time when the current becomes the desired value Iclamp is calculated based on the obtained forward transfer characteristic. Then, the output of the trimming circuit 207 is adjusted in advance so that the calculated voltage Vgate_OC can be obtained.

Concretely, at the time of the characteristic test in the wafer state, zapping is performed by flowing a large current in the first trimming terminal 220 and the second trimming terminal 221, at least one of the ZAP Zener diode 222 or 223 is broken and eternally short-circuited, and a voltage dividing point closest to the desired voltage Vgate_OC of the divided voltages by the voltage dividing resistors 207R1 to 207R3 is selected, whereby the voltage outputted to the node 213 from the trimming circuit 207 is adjusted. In other words, the voltage outputted to the node 213 can be adjusted by suitably selecting the voltage dividing ratio of the voltage dividing resistors 207R1 to 207R3.

Figure 6:
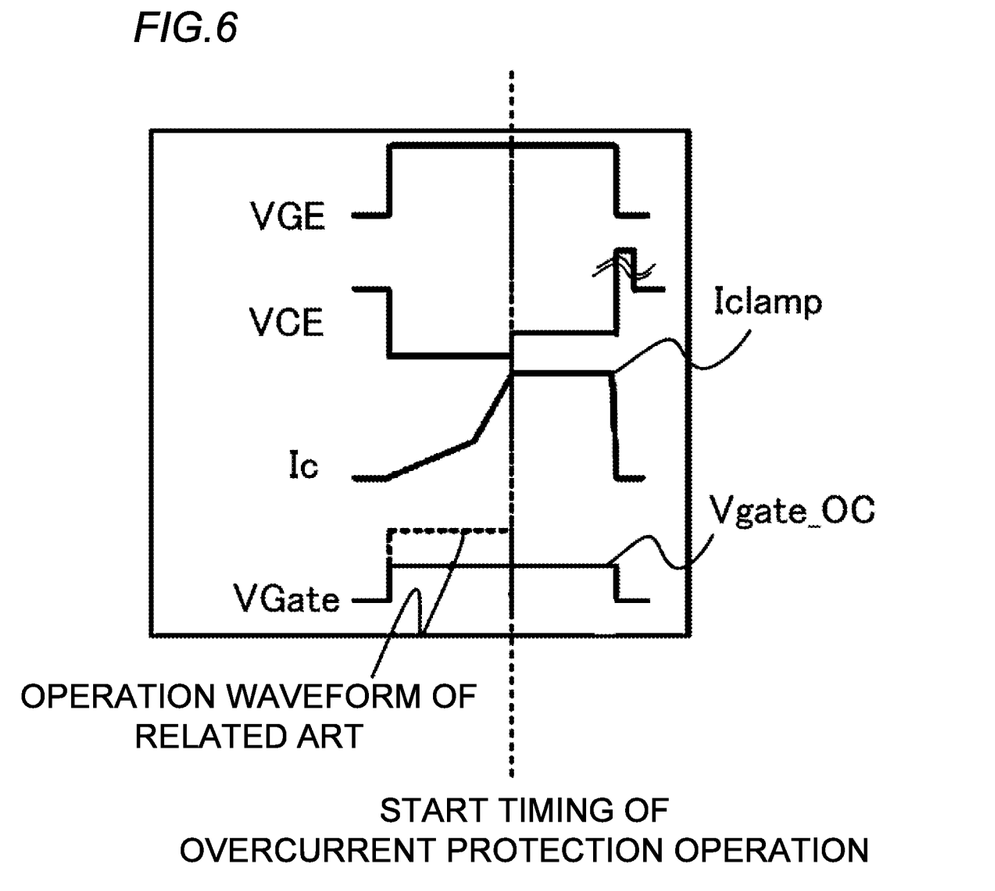
FIG. 6 is a waveform diagram for explaining an element protection action of the one-chip igniter.

The element protection action of the embodiment will be further explained with reference to FIG. 6. When any abnormality occurs in an ignition control system of the internal combustion engine, a current Ic flowing in the power semiconductor switching element 201 becomes large. In the related art using the shunt resistor and the current sensing IGBT, the protection operation is started when the current Ic reaches the upper limit value Iclamp and thus the voltage applied to the gate of the power semiconductor switching element 201 is reduced, whereby the overcurrent is suppressed to the value Iclamp. In contrast, according to the present embodiment, the voltage applied to the gate of the power semiconductor switching element 201 is set to be lower than Vgate_OC corresponding to the upper limit value Iclamp of the current allowed to flow in the power semiconductor switching element 201. Thus, even when any abnormality occurs and so the current Ic increases, the current Ic does not become Iclamp or more. That is, when the explanation is made from a viewpoint different from the above-described explanation, according to the present embodiment, the gate voltage corresponding to the maximum current allowed to flow in the power semiconductor switching element 201 is obtained at the time of the characteristic test, and the gate voltage equal to or larger than the obtained gate voltage is not applied. Thus, the overcurrent having a magnitude causing element breakdown is prevented from flowing in the power semiconductor switching element 201.

(Effects)

As explained above, according to the present embodiment, the element protection function is achieved by adjusting the gate voltage of the IGBT 201 in advance. That is, the IGBT 201 can be protected from the overcurrent without using the shunt resistor for detecting a current or the current sensing IGBT. Thus, the chip can be downsized and the one-chip igniter 100 less expensive than in the related art can be provided.

Further, the shunt resistor, the current sensing IGBT, and the current sensing resistor associated therewith are not used, and so it is not necessary to consider the characteristic variation of these elements. Thus, the element protection function with higher accuracy can be achieved by removing the influence of the characteristic variation.

Moreover, there is no positional constraint on the disposing positions of the current sensing IGBT and the associated current sensing resistor, and thus the chip design of the one-chip igniter 100 can be relatively easy.

Although the embodiment according to the present invention is explained above, the present invention is not limited to the above-described embodiment. For example, the embodiment is explained as to the case where the trimming circuit 207 adopts the ZAP Zener diodes 222, 223, but the present invention is not limited thereto. For example, the trimming circuit 207 may be configured using a semiconductor fuse. The trimming method, and the kinds and the number of the elements used in the trimming circuit are not particularly limited. The present invention can be, for example, usable for various applications and changed in various manners in a range not departing from the technical scope of the present invention so long as a configuration is adopted in which the gate voltage corresponding to the upper limit value of the overcurrent is obtained in advance without using the current detection elements and the gate voltage is applied to the gate of the IGBT.

Although the embodiment is explained as to the case where the power semiconductor switching element 201 is the normally-off type IGBT, a power MOSFET or the like may be used as the power semiconductor switching element, for example, in a use where a required withstand voltage is relatively small and a higher switching operation is required. In this case, the gate voltage corresponding to the upper limit value of the overcurrent may be obtained, for example, by acquiring a sub-threshold characteristic of the power MOSFET to be used, as an example of the characteristic obtained in the characteristic test.

The invention claimed is:

1. A semiconductor device comprising:
    a power semiconductor switching element having terminals and including a characteristic test terminal connected to one of the terminals of the power semiconductor switching element; and
    a control circuit configured to control an operation of the power semiconductor switching element, wherein the power semiconductor switching element and the control circuit are formed in a same chip,
    the control circuit including a gate voltage generation circuit configured to generate a current limit gate voltage to restrict an overcurrent flowing in the power semiconductor switching element in a desired range when an abnormality occurs, based on a characteristic of the power semiconductor switching element which is measured in advance by applying a voltage to the characteristic test terminal of the power semiconductor switching element.

2. The semiconductor device according to claim 1, wherein the power semiconductor switching element includes a normally-off type IGBT having a gate as the one of the terminals, the characteristic test terminal is connected to the gate of the IGBT, and the characteristic is a forward transfer characteristic which represents a relationship between a collector-emitter current and a gate voltage of the IGBT.

3. The semiconductor device according to claim 1, wherein the gate voltage generation circuit includes a constant current supply, a load, and a trimming circuit and is configured to generate the current limit gate voltage.

4. The semiconductor device according to claim 3, wherein the trimming circuit is configured to control a value of the current limit gate voltage based on a voltage dividing ratio between voltages divided by resistors.

5. A semiconductor device comprising:
    a power semiconductor switching element including a characteristic test terminal; and
    a control circuit configured to control an operation of the power semiconductor switching element, the power semiconductor switching element and the control circuit being formed in a same chip, the control circuit including a gate voltage generation circuit configured to generate a current limit gate voltage to restrict an overcurrent flowing in the power semiconductor switching element in a desired range when an abnormality occurs, based on a characteristic of the power semiconductor switching element which is measured in advance by applying a voltage to the characteristic test terminal,
    the power semiconductor switching element including a normally-off type IGBT, the characteristic test terminal being connected to a gate of the IGBT, and the characteristic being a forward transfer characteristic which represents a relationship between a collector-emitter current and a gate voltage of the IGBT.

6. A semiconductor device comprising:
    a power semiconductor switching element including a characteristic test terminal; and
    a control circuit configured to control an operation of the power semiconductor switching element, the power semiconductor switching element and the control circuit being formed in a same chip, the control circuit including a gate voltage generation circuit configured to generate a current limit gate voltage to restrict an overcurrent flowing in the power semiconductor switching element in a desired range when an abnormality occurs, based on a characteristic of the power semiconductor switching element which is measured in advance by applying a voltage to the characteristic test terminal,
    the gate voltage generation circuit including a constant current supply, a load, and a trimming circuit, and being configured to generate the current limit gate voltage.

7. The semiconductor device according to claim 6, wherein the trimming circuit is configured to control a value of the current limit gate voltage based on a voltage dividing ratio between voltages divided by resistors.

* * * * *